United States Patent
Yoshida

(10) Patent No.: US 9,234,299 B2
(45) Date of Patent: Jan. 12, 2016

(54) METHOD FOR PRODUCING GROUP III NITRIDE SINGLE CRYSTAL

(75) Inventor: Takehiro Yoshida, Tsuchiura (JP)

(73) Assignee: SCIOCS COMPANY LIMITED, Hitachi-Shi, Ibaraki-Ken (JP)

( * ) Notice: Subject to any disclaimer, the term of this patent is extended or adjusted under 35 U.S.C. 154(b) by 2517 days.

(21) Appl. No.: 12/003,231

(22) Filed: Dec. 20, 2007

(65) Prior Publication Data

US 2009/0056618 A1 Mar. 5, 2009

(30) Foreign Application Priority Data

Sep. 3, 2007 (JP) ................. 2007-227412

(51) Int. Cl.
| C30B 25/02 | (2006.01) |
| C30B 29/40 | (2006.01) |
| C30B 25/18 | (2006.01) |

(52) U.S. Cl.
CPC ............... *C30B 29/403* (2013.01); *C30B 25/02* (2013.01); *C30B 25/18* (2013.01)

(58) Field of Classification Search
USPC ........................ 117/84, 90, 91, 92, 103, 95, 96
See application file for complete search history.

(56) References Cited

U.S. PATENT DOCUMENTS

| 6,596,079 B1 | 7/2003 | Vaudo et al. |
| 6,924,159 B2 | 8/2005 | Usui et al. |
| 7,420,261 B2 * | 9/2008 | Dwili ski et al. ............. 257/615 |
| 2004/0261692 A1 * | 12/2004 | Dwilinski et al. ............. 117/84 |

FOREIGN PATENT DOCUMENTS

| JP | 2003-527296 | 9/2003 |
| JP | 3631724 | 12/2004 |

\* cited by examiner

*Primary Examiner* — Robert M Kunemund
(74) *Attorney, Agent, or Firm* — McGinn IP Law Group, PLLC

(57) ABSTRACT

A method for producing a group III nitride single crystal (ingot) includes providing a seed crystal comprising a first crystal face that is perpendicular to a growth direction of the single crystal and has a first predetermined area, and a second crystal face that is inclined to the growth direction and has a second predetermined area and growing the group III nitride single crystal on the first crystal face and the second crystal face by controlling a growth condition of the single crystal so as not to change the first predetermined area and the second predetermined area. A method for producing a group III nitride single crystal substrate includes further cutting the group III nitride single crystal substrate off from the grown group III nitride single crystal (ingot).

13 Claims, 3 Drawing Sheets

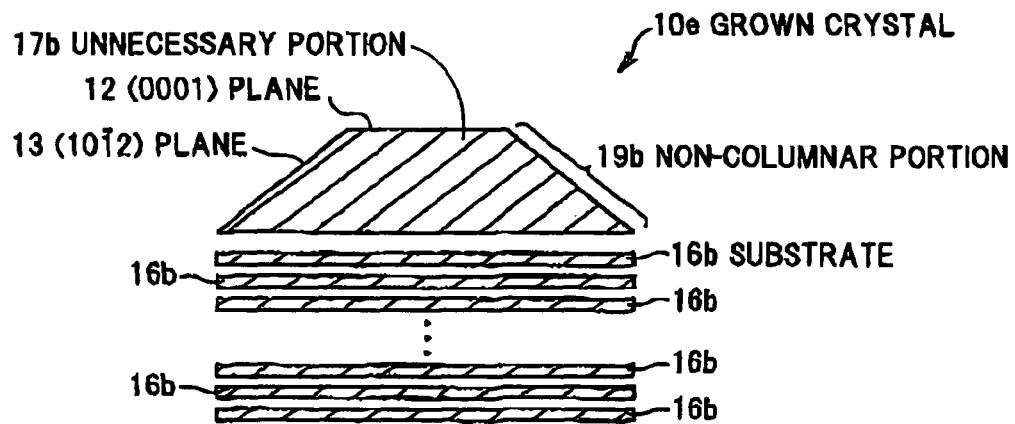
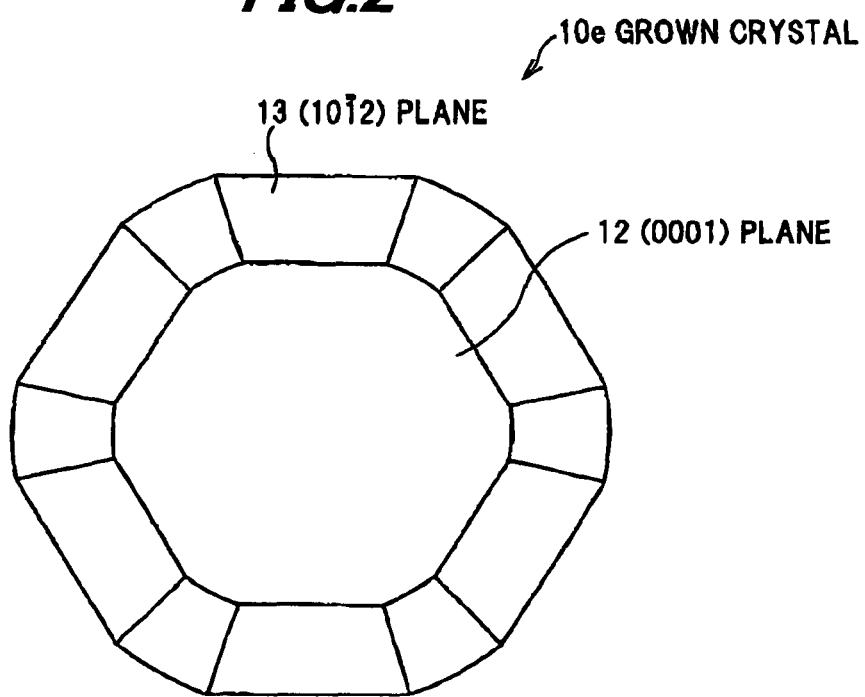

METHOD FOR PRODUCING GROUP III NITRIDE SINGLE CRYSTAL

The present application is based on Japanese patent application No. 2007-227412 filed on Sep. 3, 2006, the entire contents of which are incorporated herein by reference.

BACKGROUND OF THE INVENTION

1. Field of the Invention

This invention relates to a method for producing a group III nitride semiconductor single crystal and a method for producing a free-standing substrate of a group III nitride semiconductor single crystal.

2. Description of the Related Art

For example, a conventional method for producing a free-standing substrate of a group III nitride semiconductor single crystal is conducted such that a GaN layer is grown on a hetero-substrate such as sapphire by HVPE (halide vapor phase epitaxy) and the hetero-substrate is removed to have a GaN free-standing substrate after the GaN growth is completed (See JP-B-3631724).

In the above method, a base substrate is formed by growing a first group III nitride semiconductor layer on a base material, a metal film is formed on the base substrate, voids are formed in the first group III nitride semiconductor layer through openings in the metal film by heat treatment, and a second group III nitride semiconductor layer is grown on the first group III nitride semiconductor layer with the voids formed therein. By using the method, the second group III nitride semiconductor layer is grown as a single crystal which yields a group III nitride semiconductor substrate with low dislocation density, good crystalline quality and no warping, and allows the easy removal of the hetero-substrate.

On the other hand, another method is proposed that an ingot of GaN single crystal is grown by using a GaN crystal as a seed crystal by HVPE, and plural GaN substrates are cut out from the grown ingot (See JP-A-2003-527296).

However, the method as disclosed in JP-B-3631724 has the drawback that it is not suited to produce the plural group III nitride semiconductor single crystal substrates at once since only one group III nitride semiconductor single crystal substrate can be obtained by each growth of the method. Also, the method as disclosed in JP-A-2003-527296 has the drawback that it only provides for a reduced area in cutting out the substrate due to a difference in crystal face orientation caused when growing the group III nitride semiconductor single crystal on the seed crystal.

SUMMARY OF THE INVENTION

It is an object of the invention to provide a method for producing a group III nitride semiconductor single crystal that does not cause the reduced area in cutting out the substrate even when repeating the crystal growth as well as allowing the cutting of the plural group III nitride semiconductor single crystal substrates at once.

It is a further object of the invention to provide a method for producing a free-standing substrate by using the group III nitride semiconductor single crystal thus produced.

(1) According to one embodiment of the invention, a method for producing a group III nitride single crystal comprises:

providing a seed crystal comprising a first crystal face that is perpendicular to a growth direction of the single crystal and has a first predetermined area, and a second crystal face that is inclined to the growth direction and has a second predetermined area; and growing the group III nitride single crystal on the first crystal face and the second crystal face by controlling a growth condition of the single crystal so as not to change the first predetermined area and the second predetermined area.

(2) According to another embodiment of the invention, a method for producing a group III nitride single crystal substrate comprises:

providing a seed crystal comprising a first crystal face that is perpendicular to a growth direction of a group III nitride single crystal ingot and has a first predetermined area, and a second crystal face that is inclined to the growth direction and has a second predetermined area;

growing the group III nitride single crystal ingot on the first crystal face and the second crystal face by controlling a growth condition of the group III nitride single crystal ingot so as not to change the first predetermined area and the second predetermined area; and cutting the group III nitride single crystal substrate off from the grown group III nitride single crystal ingot.

BRIEF DESCRIPTION OF THE DRAWINGS

The preferred embodiments according to the invention will be explained below referring to the drawings, wherein:

FIGS. 1A to 1I are schematic cross sectional views showing respective steps in a method for producing a group III nitride semiconductor single crystal in a first preferred embodiment according to the invention; and FIG. 2 is a schematic top view showing a group III nitride semiconductor single crystal produced by using the method of the first embodiment.

DETAILED DESCRIPTION OF THE PREFERRED EMBODIMENTS

First Embodiment

FIGS. 1A to 1I are schematic cross sectional views showing respective steps in a method for producing a group III nitride semiconductor single crystal in the first preferred embodiment according to the invention.

Method for Producing Group III Nitride Semiconductor Single Crystal

At first, on c-plane as (0001) plane of a sapphire substrate with a diameter of 62.5 mm, a 300 nm thick GaN film as a group III nitride thin film is grown by using an MOCVD (metalorganic chemical vapor deposition) system. Then, a 20 nm thick Ti thin film is formed on the grown GaN thin film by a vacuum deposition system. Then, in atmosphere with a mixture of ammonia ($NH_3$) and hydrogen ($H_2$), heat treatment is conducted at 1060° C. for 30 min, so that a mesh TiN nanomask can be formed and many voids can be generated at the interface of Ti/GaN.

Then, on the TiN nanomask, a 720 μm thick GaN thick film as a group III nitride thick film is grown by using an HVPE (halide vapor phase epitaxy) system. The growth conditions are as follows. Carrier gas: $N_2$, source gas: $NH_3$ as a group V material and GaCl as a group III material, growth temperature: 1060° C., growth pressure: normal pressure, GaCl partial pressure in the source gas: $8.1 \times 10^2$ Pa ($8 \times 10^{-3}$ atm), and $NH_3$ partial pressure in the source gas: $8.1 \times 10^3$ Pa ($8 \times 10^{-2}$ atm).

Figure 1A:
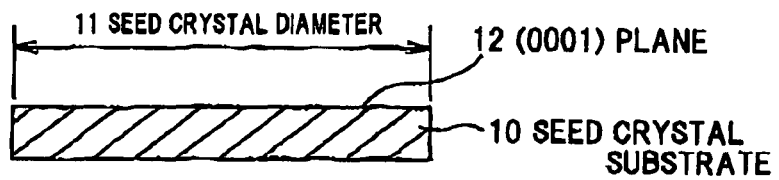

When the GaN thick film is grown on the TiN nanomask by the HVPE system, the GaN thick film can be easily removed at the interface of the GaN thick film/Ti. Thereby, a GaN free-standing substrate as a group III nitride semiconductor can be obtained that has c-plane, i.e., (0001) plane 12 as a principal plane and a diameter of 56 mm. Then, the freestanding substrate is lapped in its outer circumference and polished in both surfaces thereof, so that a GaN substrate as a group III nitride semiconductor substrate can be obtained with a diameter (=seed crystal diameter 11) of 50 mm and a thickness of 350 µm. The GaN substrate thus obtained has a dislocation density of about $3 \times 10^6$ cm$^{-2}$. Thus, as shown in FIG. 1A, the seed crystal GaN substrate 10 as a seed crystal with the (0001) plane 12 can be formed.

Then, by using the seed crystal GaN substrate 10 as a seed crystal for GaN crystal growth, a single crystal of group III nitride semiconductor represented by $Al_xGa_{1-x}N$ ($0 \le x \le 1$) is grown on the seed crystal GaN substrate 10. For example, a GaN single crystal as the single crystal of group III nitride semiconductor is grown on the seed crystal GaN substrate 10. In detail, a GaN ingot as an ingot of the single crystal of group III nitride semiconductor is grown 10 mm in total thickness on the seed crystal GaN substrate 10. Since the total thickness is 10 mm, the GaN crystal grown on the seed crystal GaN substrate 10 only needs to have a thickness of 9.65 mm.

For example, the growth conditions for the GaN crystal are such that a partial pressure of GaCl in the source gas supplied into the HVPE reactor is $2.53 \times 10^3$ Pa ($2.5 \times 10^{-2}$ atm) and a partial pressure of NH$_3$ in the source gas is $14.9 \times 10^3$ Pa ($14.7 \times 10^{-2}$ atm).

In vapor phase growth such as HVPE growth, anisotropy in growth rate of crystal is caused being dependent upon the plane direction. Thus, when an ingot is grown, a growth form thereof is produced that is surrounded by a first growth face grown at a first growth rate and a second growth face grown at a second growth rate more than the first growth rate. For example, if the group III nitride semiconductor is GaN, when growing a GaN single crystal by HVPE, a growth form is likely to occur that is surrounded by (0001) plane as the first growth face and (10-12) plane as the second growth face. Meanwhile, "-n" (n: positive integer) as in "(10-12)" expressed by Miller index means being orthogonal to a predetermined coordinate axis in negative direction.

Figure 1B:
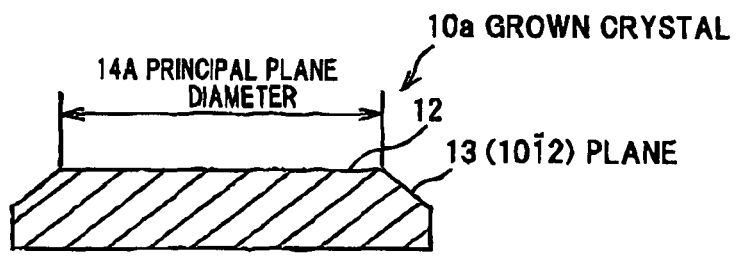
Figure 1C:
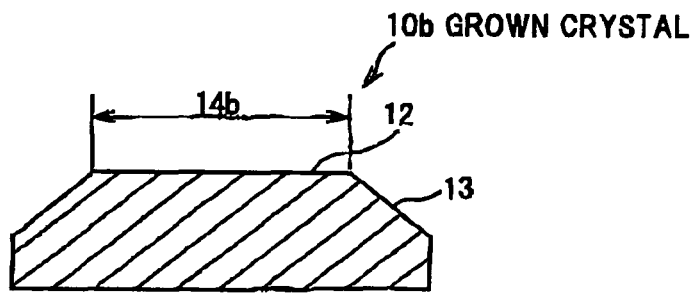
Figure 1D:
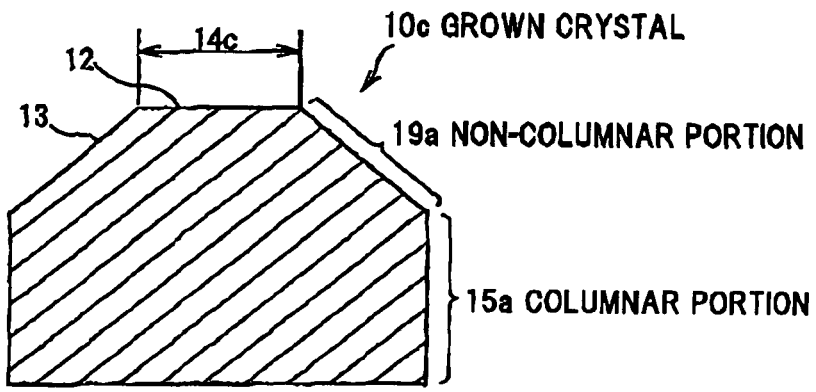

For example, as shown in FIGS. 1B to 1D, according as the GaN crystal grown on the seed crystal GaN substrate 10 grows, a principal plane diameter 14a of the ingot decreases. In other words, the GaN crystal grows in the order of a grown crystal 10a, a grown crystal 10b and a grown crystal 10c, where a principal plane diameter 14b of the grown crystal 10b becomes smaller than the principal plane diameter 14a of the grown crystal 10a, and a principal plane diameter 14c of the grown crystal 10c becomes smaller than the principal plane diameter 14b of the grown crystal 10b.

In this regard, the inventor finds that the change of the growth form comes to equilibrium although the growth form becomes small gradually according to the development in crystal growth, and that, when the change of the growth form comes to the equilibrium, the reduction of the principal plane diameter stops and a columnar portion 15a is developed. Although the equilibrium form of the GaN crystal depends on the crystal growth conditions, under the crystal growth conditions of the embodiment, an equilibrium form as shown in FIG. 1D can be obtained that includes a non-columnar portion 19a with a thickness of 3.6 mm. If the GaN crystal is grown up to 10 mm in total thickness, the grown crystal 10c can be obtained that includes the columnar portion 15a with a thickness of 6.4 mm (measured in the thickness direction from the bottom) and the non-columnar portion 19a with a thickness of 3.6 mm.

Figure 1E:
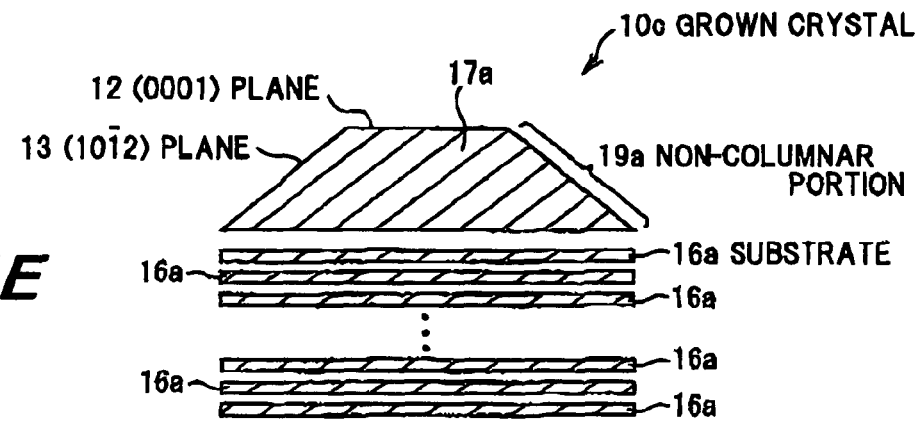

Then, as shown in FIG. 1E, by using a wire saw, the columnar portion 15a is cut off from the non-columnar portion 19a at a distance of 6.3 mm in the thickness direction from the bottom of the grown crystal 10c. A margin of the cutting by the wire saw is, e.g., 200 µm. The columnar portion 15a is further cut by the wire saw to have a substrate 16a (as a GaN substrate) with a thickness of 600 µm. For example, the eight GaN substrates can be yielded. For example, the dislocation density of a GaN substrate cut out at a position close to the top of the ingot is about $6 \times 10^5$ cm$^{-2}$, and that at a position close to the bottom of the ingot is about $3 \times 10^6$ cm$^{-2}$ Meanwhile, an unnecessary portion 17a which corresponds to the non-columnar portion 19a as shown in FIG. 1E is not suited to cut the GaN substrate with a desired diameter.

Figure 1F:
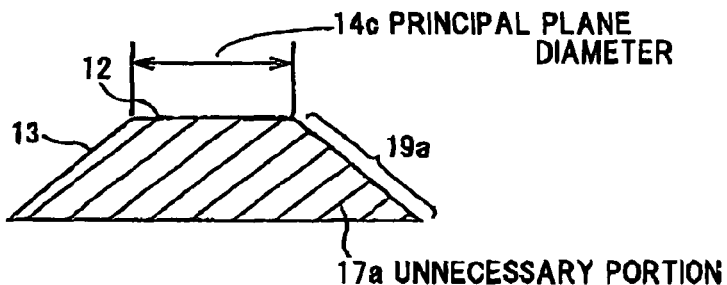

Then, since the unnecessary portion 17a cannot be used to cut the GaN substrate with a desired diameter, it is used as a seed crystal for growing a GaN single crystal ingot on the next growth process. As shown in FIG. 1F, the unnecessary portion 17a has a trapezoidal section with the principal plane diameter 14c. In other words, the unnecessary portion 17a has the (0001) plane 12 as the first growth face, i.e., the principal plane, perpendicular to the growth direction and with a first predetermined area, and the (10-12) plane 13 as the second growth face inclined by a predetermined angle to the growth direction and with a second predetermined area. In this embodiment, by using the unnecessary portion 17a, a GaN single crystal ingot is again grown up to 10 mm in total thickness. Here, since the unnecessary portion 17a has a thickness of about 3.6 mm, the GaN single crystal is grown by about 6.4 mm.

Figure 1G:
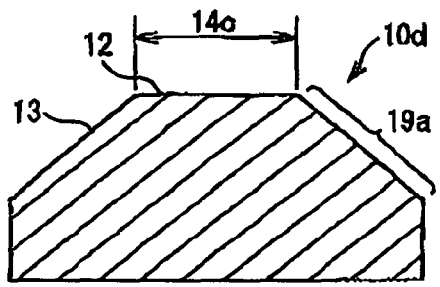
Figure 1H:
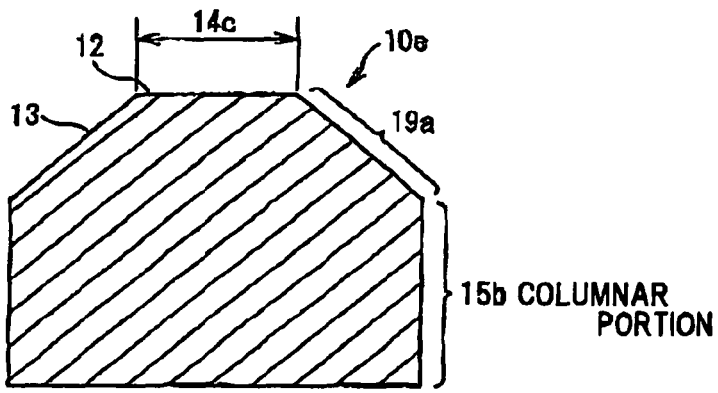

The growth conditions are the same as those used when the seed crystal GaN substrate 10 comes to equilibrium in the crystal growth of the seed crystal GaN substrate 10. In this embodiment, since the unnecessary portion 17a already achieves the equilibrium under the above growth conditions, as shown in FIGS. 1F to 1H, only the columnar portion 15a grows. It is not suitable that the length (thickness) of the columnar portion 15a varies every time when the ingot grows. Thus, the use of the growth conditions different from those used when the seed crystal GaN substrate 10 comes to equilibrium should be avoided where the equilibrium form of the crystal obtained varies such that the length of the columnar portion of the ingot varies.

When the GaN crystal is grown by using the unnecessary portion 17a as a seed crystal under the conditions as above, as shown in FIGS. 1F to 1H, it grows in the order of a grown crystal 10d and a grown crystal be, where the principal plane diameter 14c of the unnecessary portion 17a is the same as the principal plane diameter 14c of the grown crystal 10d and the grown crystal 10e. In other words, while the first predetermined area of the principal plane at the top of the ingot with the (0001) plane 12 and the second predetermined area of the non-columnar portion 19a with the (10-12) plane 13 exposed thereon are kept the same as before, the GaN single crystal is grown on the unnecessary portion 17a. Thus, as shown in FIG. 1H, the grown crystal 10e can be obtained that includes the columnar portion 15a with a thickness of 6.4 mm and the non-columnar portion 19a with a thickness of 3.6 mm.

Then, as shown in FIG. 1I, by using the wire saw, the columnar portion 15b is cut off from the non-columnar portion 19a at a distance of 6.3 mm in the thickness direction from the bottom of the grown crystal 10e. A margin of the cutting by the wire saw is, e.g., 200 µm. The columnar portion 15b is further cut by the wire saw to have a substrate 16b (as a GaN substrate) with a thickness of 600 µm. For example, the eight GaN substrates can be yielded. For example, the dislocation density of a GaN substrate cut out at a position close to the top of the ingot is about $2 \times 10^5$ cm$^{-2}$, and that at a position close to the bottom of the ingot is about $6 \times 10^6$ cm$^{-2}$.

FIG. 2 is a schematic top view showing a group III nitride semiconductor single crystal produced by using the method of the first embodiment.

In the production method of the group III nitride single crystal in the first embodiment, the principal plane diameter 14c of the grown crystal 10e is the same as the principal plane diameter 14c of the unnecessary portion 17a as a seed crystal at the starting of the production. In other words, an area with the (0001) plane 12 exposed thereon after the completion of the growth is kept substantially the same as that at the starting of the growth. In like manner, the area of the non-columnar portion 19a with the (10-12) plane exposed thereon after the completion of the growth kept substantially the same as that at the starting of the growth.

Meanwhile, the unnecessary portion 17a cut away as shown in FIG. 1I can be used as a seed crystal for the next process, i.e., next-generation group III nitride single crystal.

Comparative Example

As a Comparative Example, by using a flat seed crystal, i.e., a seed crystal substrate 10, not surrounded by the first crystal face and the second crystal face, a group III nitride single crystal is grown. The production method of the group III nitride single crystal in Comparative Example is conducted by repeating the steps as shown in FIGS. 1A to 1D. Here, in order to grow an ingot with a total thickness of 10 mm, a 9.65 mm thick crystal needs to be grown since the seed crystal substrate 10 has a thickness of 350 μm. In Comparative Example, as explained earlier referring to FIGS. 1A to 1E, eight single crystal substrates 16a can be obtained.

On the other hand, in the embodiment of the invention, as explained earlier referring to FIGS. 1F to 1I, the eight single crystal substrates 16a can be obtained by growing only the 6.4 mm thick single crystal on the unnecessary portion 17a. In comparing Comparative Example with the embodiment of the invention, the embodiment of the invention only has to grow a crystal thinner than that of Comparative Example so as to produce the same number of the single crystal substrates as Comparative Example.

Effects of the First Embodiment

In the production method of the group III nitride single crystal in the first embodiment, the seed crystal substrate with the growth form achieving the equilibrium is used and the production method is conducted under the same growth conditions as used when the seed crystal substrate achieves the equilibrium. Therefore, the first embodiment can produce the same number of the group III nitride single crystal substrates as produced when the ingot is grown from the seed crystal without the non-columnar portion. Although the unnecessary portion with the non-columnar portion is discarded so far, the embodiment can use the unnecessary portion as a seed crystal for the next growth process of the group III nitride single crystal substrates or after. Thus, the embodiment does not waste the material and can produce the high-quality group III nitride single crystal substrates.

In the production method of the group III nitride single crystal in the first embodiment, the unnecessary portion with the non-columnar portion can be used as the seed crystal for the next growth process or after. Therefore, in the next growth process or after, time required for growing the unnecessary portion again can be omitted so that the total time for the growth of the group III nitride single crystal substrates can be shortened significantly.

In general, according as the growth of an ingot is developed, the dislocation density of the single crystal lowers. Here, in the production method of the group III nitride single crystal in the first embodiment, the unnecessary portion used as the seed crystal for the next growth process or after is cut off from the portion that the growth is most sufficiently developed in the thickness direction. Thus, the lowest portion in dislocation density of the group III nitride single crystal ingot is cut out as the seed crystal. By using the cut unnecessary portion as the seed crystal for the next growth process or after, the dislocation density of the group III nitride single crystal grown on the next growth process can be reduced. In brief, the production method of the group III nitride single crystal in the first embodiment is suited to grow the group III nitride single crystal with a low dislocation density.

Second Embodiment

A method for producing an AlN single crystal as a group III nitride single crystal in the second preferred embodiment of the invention will be described below (though not shown).

At first, an AlN thin film with a diameter of 62.5 mm is grown 600 μm on a (111) Si single crystal substrate by using the HVPE reactor. The growth conditions of the AlN thin film by HVPE are as follows. The growth temperature is 1200° C., and source materials for the AlN are $AlCl_3$ and $NH_3$. A partial pressure of $AlCl_3$ in the source gas supplied into the HVPE reactor is 60.8 Pa and a partial pressure of $NH_3$ in the source gas is 243.2 Pa. The growth of the AlN thin film in the HVPE reactor is conducted at normal pressure while supplying $H_2$ as carrier gas.

Then, after the AlN thin film is grown on the Si single crystal substrate, the Si substrate is etched by hydrofluoric nitric acid and hydrofluoric acid, where an AlN free-standing substrate can be obtained that has c-plane as a principal plane and a diameter of 56 mm. Then, the AlN free-standing substrate is lapped in its outer circumference and polished in both surfaces thereof, so that an AlN substrate can be obtained with a diameter of 50 mm and a thickness of 350 μm.

Then, by using the AlN substrate as a seed crystal, an AlN ingot is grown 10 mm in total thickness on the seed crystal AlN substrate. Since the total thickness is 10 mm, the AlN crystal grown on the seed crystal AlN substrate only needs to have a thickness of 9.65 mm. The growth of the AlN ingot is conducted at 1200° C. by using source gas at $AlCl_3$ partial pressure of 197.0 Pa and $NH_3$ partial pressure of 788.0 Pa.

In vapor phase growth such as HVPE growth, anisotropy in growth rate of crystal is caused being dependent upon the plane direction. Thus, when the ingot is grown, a growth form thereof is produced that is surrounded by a first growth face grown at a first growth rate and a second growth face grown at a second growth rate more than the first growth rate. In this regard, the inventor finds that the change of the growth form comes to equilibrium although the growth form becomes small gradually according to the development in crystal growth, and that, when the change of the growth form comes to the equilibrium, the reduction of the principal plane diameter stops and a columnar portion is developed. Under the AlN single crystal growth conditions of the second embodiment, an equilibrium form can be obtained that includes a columnar portion with a thickness of 5.37 mm. As a result, the AlN single crystal ingot can be obtained that includes the columnar portion and the non-columnar portion.

Then, by using a wire saw, the columnar portion is cut off from the non-columnar portion at a distance of 4.7 mm in the thickness direction from the bottom of the grown AlN ingot. Here, on the non-columnar portion side of the AlN single crystal, the columnar portion is left 0.67 mm. A margin of the cutting by the wire saw is 200 μm. The columnar portion is further cut by the wire saw to have six AlN substrates each having a thickness of 600 μm.

Then, by using the 5.2 mm thick unnecessary portion with the non-columnar portion as a seed crystal in the second embodiment, an AlN single crystal ingot is again grown up to 10 mm in total thickness on the seed crystal. Thus, in the second embodiment, the AlN single crystal with the non-columnar portion is use as the seed crystal.

Here, since the AlN single crystal ingot is grown up to 10 mm in total thickness on the seed crystal with the non-columnar portion, the thickness of the AlN single crystal grown additionally is 4.8 mm. The growth of the ingot is conducted under the same as used when the seed crystal achieves the equilibrium. The main plain diameter of the AlN (0001) plane obtained after the growth is the same as that of the AlN (0001) plane of the seed crystal used for the growth. Thus, the AlN ingot having the columnar portion with a thickness of 5.37 mm can be obtained again.

Then, by using the wire saw, the columnar portion is cut off from the non-columnar portion at a distance of 4.7 mm in the thickness direction from the bottom of the grown AlN ingot. A margin of the cutting by the wire saw is 200 μm. The columnar portion is further cut by the wire saw to have six AlN substrates each having a thickness of 600 μm.

As described above, if the ingot is grown by using the conventional flat AlN substrate as a seed crystal, the 9.65 mm thick AlN single crystal needs to be grown to obtain six AlN substrates. In the second embodiment, when the ingot is grown by using the seed crystal with the non-columnar portion and the columnar portion, only the 4.8 mm thick AlN single crystal needs to be grown to obtain six AlN substrates. Thus, in analogy with the first embodiment, the second embodiment does not waste the material and can produce the high-quality AlN single crystal substrates.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method for producing a group III nitride single crystal, the method comprising:
    providing a seed crystal comprising a first crystal face that is perpendicular to a growth direction of the single crystal and has a first predetermined area, and a second crystal face that is inclined to the growth direction and has a second predetermined area; and
    growing the group III nitride single crystal on the first crystal face and the second crystal face by vapor phase growth and by controlling a growth condition of the single crystal so as not to change the first predetermined area and the second predetermined area.

2. The method according to claim 1, wherein the first crystal face comprises a (0001) plane, and
    wherein the second crystal face comprises a (10-12) plane.

3. The method according to claim 1, wherein the growth condition comprises a growth condition that a shape of the group III nitride single crystal comprising the first crystal face and the second crystal face comprises an equilibrium form.

4. The method according to claim 1, wherein the growth condition comprises a same growth condition as that for growing the seed crystal.

5. The method according to claim 1, wherein the group III nitride single crystal comprises $Al_xGa_{1-x}N$ ($0 \leq x \leq 1$).

6. A method for producing a group III nitride single crystal substrate, the method comprising:
    providing a seed crystal comprising a first crystal face that is perpendicular to a growth direction of a group III nitride single crystal ingot and has a first predetermined area and a second crystal face that is inclined to the growth direction and has a second predetermined area;
    growing the group III nitride single crystal ingot on the first crystal face and the second crystal face by vapor phase growth and by controlling a growth condition of the group III nitride single crystal ingot so as not to change the first predetermined area and the second predetermined area; and
    cutting the group III nitride single crystal substrate off from the grown group III nitride single crystal ingot.

7. The method according to claim 6, wherein the first crystal face comprises a (0001) plane.

8. The method according to claim 6, wherein the growth condition is such that a shape of the group III nitride single crystal ingot comprising the first crystal face and the second crystal face comprises an equilibrium form.

9. The method according to claim 6, wherein the seed crystal comprises a (0001) plane.

10. The method according to claim 6, wherein the vapor phase growth comprises an HVPE (halide vapor phase epitaxy) growth.

11. The method according to claim 1, wherein the first crystal face comprises a (0001) plane.

12. The method according to claim 1, wherein the seed crystal comprises a (0001) plane.

13. The method according to claim 1, wherein the vapor phase growth comprises an HVPE (halide vapor phase epitaxy) growth.

* * * * *